United States Patent
Hirler

(10) Patent No.: US 7,253,471 B2
(45) Date of Patent: Aug. 7, 2007

(54) SEMICONDUCTOR STRUCTURE HAVING THICK STABILIZATION LAYER

(75) Inventor: Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/855,794

(22) Filed: May 27, 2004

(65) Prior Publication Data

US 2005/0017291 A1    Jan. 27, 2005

(30) Foreign Application Priority Data

May 30, 2003  (DE) .............................. 103 24 751

(51) Int. Cl.
 *H01L 29/76*  (2006.01)
(52) U.S. Cl. ............... 257/327; 257/328; 257/329; 257/330; 257/331; 257/332; 257/333; 257/334
(58) Field of Classification Search ............... 257/329, 257/330, 331, 332, 334, 341
See application file for complete search history.

(56) References Cited

U.S. PATENT DOCUMENTS

| 5,602,046 | A |   | 2/1997 | Calafut et al. |
|---|---|---|---|---|
| 6,015,990 | A | * | 1/2000 | Hieda et al. ................. 257/310 |
| 6,066,877 | A | * | 5/2000 | Williams et al. ............ 257/341 |
| 2002/0030224 | A1 | * | 3/2002 | Hshieh et al. ............... 257/329 |
| 2002/0142548 | A1 | * | 10/2002 | Takaishi ..................... 438/270 |

FOREIGN PATENT DOCUMENTS

DE         100 43 955 A1    4/2002

* cited by examiner

*Primary Examiner*—Evan Pert
*Assistant Examiner*—Tan Tran
(74) *Attorney, Agent, or Firm*—Maginot Moore & Beck

(57) ABSTRACT

A semiconductor structure has a semiconductor substrate (3, 4), on/in whose top side a structure comprising semiconductor layers, metal layers and insulator layers (5) is applied/impressed. An as far as possible contiguous stabilization layer (6, 10) made of metal and/or passivation material is applied on the applied/impressed metal/semiconductor/insulator layer structure (5).

8 Claims, 2 Drawing Sheets

SEMICONDUCTOR STRUCTURE HAVING THICK STABILIZATION LAYER

BACKGROUND

The invention relates to a semiconductor structure and to a method for fabricating such a structure, and in particular a DMOS/IGBT structure.

DMOS transistors and IGBT (Insulated Gate Bipolar Transistor) transistors are known electronic components which are employed in a multiplicity of components appertaining to electronics. One important characteristic quantity of such components is their on resistivity $R_{on}*A$ ($R_{on}$=on resistance; A=cross-sectional area of the resistance). The latter should be kept as low as possible since a low on resistivity entails low static power losses and also high current densities. The on resistivity is substantially influenced by the thickness of the semiconductor substrates (carrier substrates) of the DMOS/IGBT components. Thus, in new generations of vertical DMOS transistors, the proportion of the total on resistivity that is brought about by the semiconductor substrate amounts to approximately ¼. Therefore, attempts are made to keep the thickness of the semiconductor substrate as thin as possible, which is effected, for example by thinning by grinding processes at the underside of the semiconductor substrate after a structure comprising further semiconductor layers and metal layers has been applied/impressed on/in the top side of the semiconductor substrate.

In the previous fabrication methods, the thickness of the semiconductor substrate for DMOS components can be reduced to the order of magnitude of 100 μm. In the case of IGBTs and diodes, it is even possible to achieve somewhat smaller semiconductor substrate thicknesses. What is problematical, however, is that losses of yield may occur relatively frequently on account of broken substrates or cracks which arise as a result of strains or warpage of the semiconductor substrate on account of the thinning by grinding processes.

Therefore, the object on which the invention is based is to specify a semiconductor structure by means of which the losses of yield are avoided as far as possible, without having to dispense with the advantages of a thin semiconductor substrate; moreover, the intention is to provide a fabrication method suitable for this.

SUMMARY

Embodiments of the invention include those set forth in the paragraphs below.

The semiconductor structure is preferably a DMOS/IGBT structure. However, the invention can be applied, in the same way as to DMOS transistors and IGBTs, more generally to MOS components, bipolar components, integrated circuits (IC's), diodes, thyristors, etc.

The semiconductor structure according to the invention has a semiconductor substrate, on/in whose top side a structure comprising semiconductor layers and metal layers and insulator layers is applied/impressed. An as far as possible contiguous stabilization layer made of metal and/or passivation material is applied on the applied/impressed metal/semiconductor/insulator layer structure. "Contiguous" is to be understood to mean that, on the one hand, no undesirable short circuits occur and, on the other hand, interruptions are smaller than the wafer thickness or smaller than 50 μm.

The application of such a stabilization layer enables the mechanical stability of the semiconductor structure to be significantly improved.

Therefore, if the semiconductor structure, in particular DMOS/IGBT structure, is subjected to further processing processes, in particular processes for reducing the thickness of the semiconductor substrate, then losses of yield on account of broken semiconductor substrates or on account of cracks can largely be avoided. Furthermore, compared with the conventional fabrication methods, it is possible to further reduce the thickness of the semiconductor substrate, whereby the on resistivity can be reduced further.

The stabilization layer does not have to be applied homogeneously over the entire metal/semiconductor/insulator layer structure, rather arbitrarily patterned stabilization layers are possible. All that is essential is that the stabilization layer is as far as possible largely contiguous in order to avoid "desired braking points". What is to be understood by "as far as possible largely contiguous" has already been explained above.

The stabilization layer may comprise arbitrary suitable materials. If metals are used, then the application of the stabilization layer can be achieved very cost-effectively for example by means of a galvanic process. In principle, arbitrary metals can be used. Copper or aluminum should preferably be used, these having very good electrical and thermal conductivities and increasing the thermal capacity.

In a preferred embodiment, the semiconductor substrate (carrier substrate) comprises a homogeneously doped semiconductor layer, the dopant concentration of which corresponds to the dopant concentration of the drift path of the DMOS/IGBT structure. This applies in particular to low-voltage DMOS components. "Low-voltage" is to be understood to mean voltages of up to about 200 V. In this case, the thickness of the semiconductor substrate is chosen such that it is equal to or only insignificantly greater than the maximum extent of a space charge zone that can be formed in the drift path of the semiconductor structure, in particular DMOS/IGBT structure. The customary construction of a semiconductor or DMOS/IGBT carrier substrate, which essentially comprises a highly doped $n^+$ type substrate and an n-type epitaxial layer applied thereon, can thus be replaced by a single, homogenously doped semiconductor layer, which reduces the fabrication costs.

Good yield rates in conjunction with low on resistivity are manifested for example when the thickness of the stabilization layer is one third of the thickness of the semiconductor substrate.

The semiconductor structure may comprise one or a plurality of semiconductor elements. The above-described advantages of the invention are afforded in intensified fashion when a plurality of semiconductor elements are fabricated together on a common semiconductor substrate (wafer), the individual elements being obtained after the conclusion of the fabrication method by sawing the wafer.

As already indicated above, the invention provides a method for fabricating a semiconductor structure according to the invention. This method comprises the following steps: application/impressing of a structure comprising semiconductor layers/metal layers/insulator layers on/in a top side of a semiconductor substrate, application of an as far as possible contiguous stabilization layer made of metal and/or passivation material on the applied/impressed metal/semiconductor/insulator layer structure, and reduction of the layer thickness of the semiconductor substrate on the basis of grinding/etching processes. If the layer structure is primarily composed of metal, then the stabilization layer made of metal may be obviated, if appropriate, so that only one metal layer is deposited with a suitable thickness.

In the case of the so-called SMART-CUT method, hydrogen is implanted with a defined depth, the structure is heated and, in the process, a layer is blasted away as far as the implanted depth. This method can also be employed.

Preferably, the layer thickness of the semiconductor substrate is thinned such that the layer thickness of the stabilization layer is one third of the layer thickness of the semiconductor substrate, but any other layer thickness ratios are also conceivable. As already mentioned, the advantages according to the invention are afforded in intensified fashion when a plurality of semiconductor elements are formed simultaneously on/in a common semiconductor substrate.

As has become clear in the previous description, it is an essential aspect of the invention not to significantly alter the overall thickness of a semiconductor structure, but rather to apply a metallization layer or passivation layer that is required anyway in a manner significantly thicker than hitherto and at the same time to thin the semiconductor substrate correspondingly.

BRIEF DESCRIPTION OF THE DRAWINGS

The invention is explained in more detail below in exemplary embodiment with reference to the accompanying figures in which.

DETAILED DESCRIPTION

Figure 1:
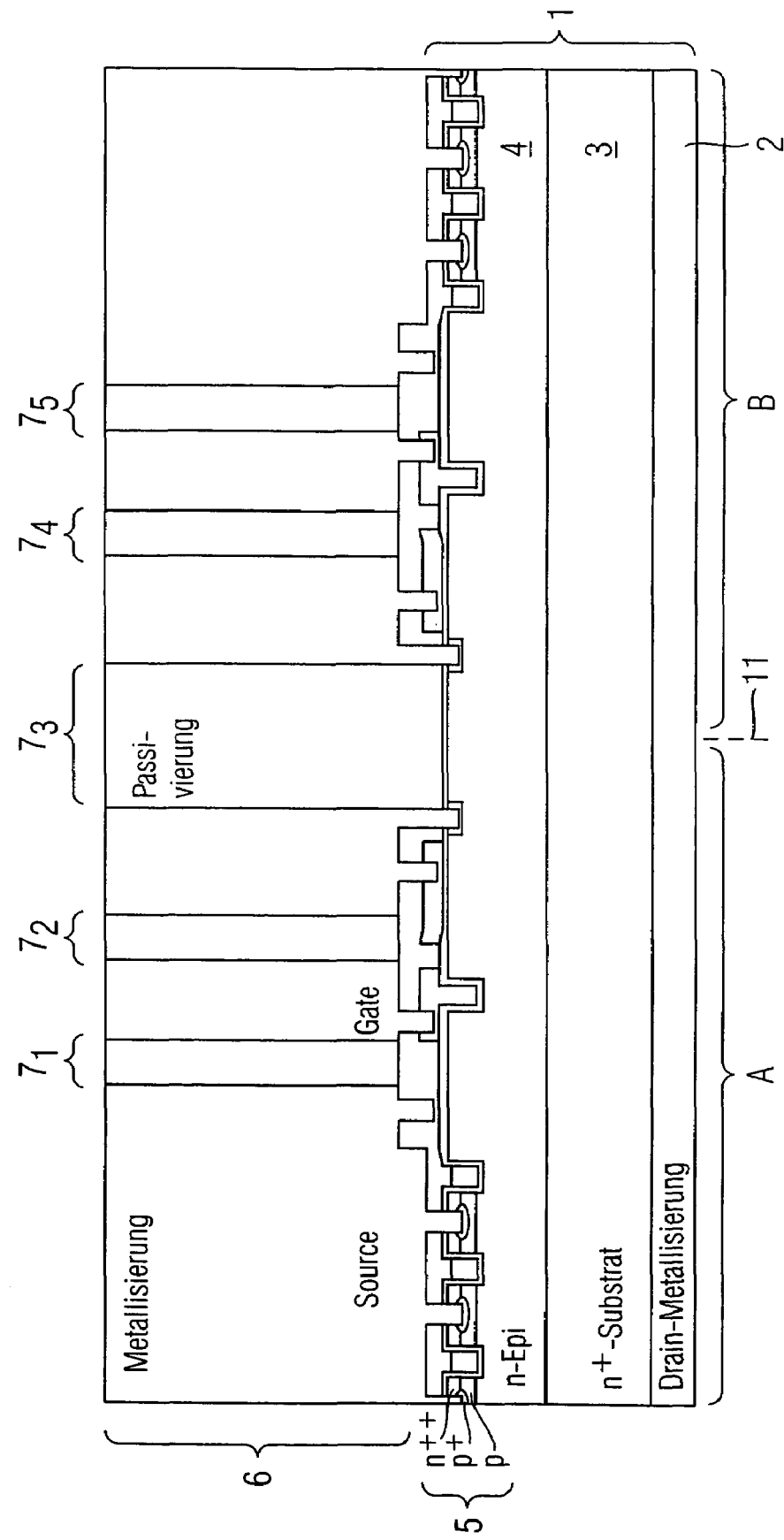
FIG. 1 shows a first example of embodiment of a DMOS structure as an example of the semiconductor structure according to the invention.
Figure 2:
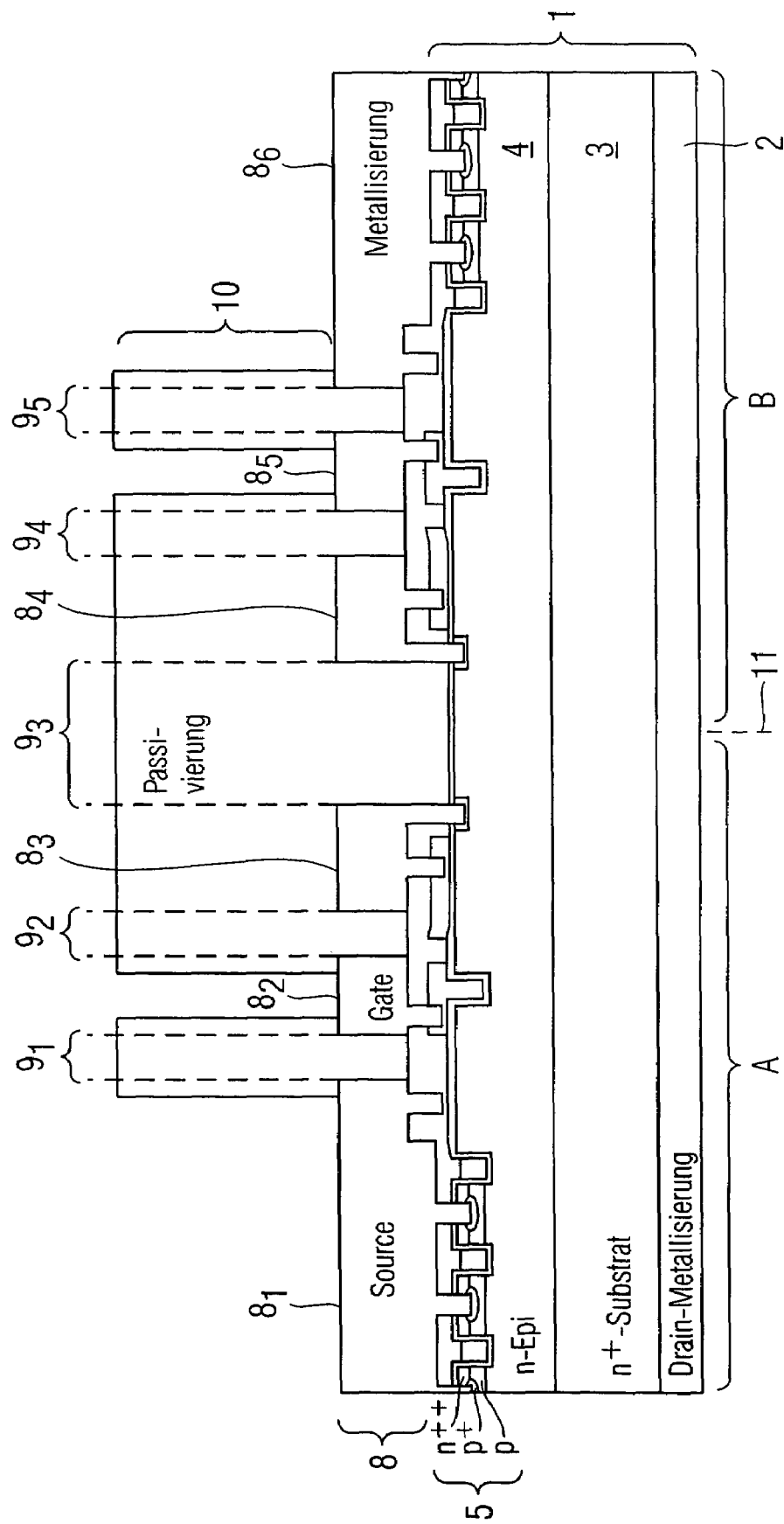
FIG. 2 shows a second example of embodiment of a semiconductor structure according to the invention.

The method for fabricating the first embodiment will be described in more detail below on the basis of a DMOS structure as an example of a semiconductor structure.

In a plurality of first process steps, a DMOS structure 1 is fabricated, which has a drain metallization 2, an n$^+$-type substrate 3, an n-type epitaxial layer 4 and also a metal/semiconductor/insulator layer structure 5 applied on the n-type epitaxial layer 4 and impressed in the n-type epitaxial layer 4. In an ideal case, the structure 5 contains no metal but rather only semiconductor and insulator layers.

In a second process step, a homogeneous stabilization layer 6 made of metal is applied to the metal/semiconductor/insulator layer structure 5. In a third process step, a structure is etched into the metal layer 6, the metal layer patterned in this way preferably being contiguous. The metal regions $7_1$ to $7_5$ etched away by the patterning are filled with a passivation material (e.g. an insulator). The combination of patterned metal layer 6 and passivation material (filled metal regions $7_1$ to $7_5$) form the stabilization layer.

The method for fabricating a second embodiment of a DMOS structure as an example of a semiconductor structure according to the invention will be described in more detail below. In this case, mutually corresponding structural parts are identified by the same reference symbols.

In a plurality of first process steps, a DMOS structure 1 is fabricated, which firstly has an n$^+$-type substrate 3, an n-type epitaxial layer 4 and also a metal/semiconductor layer structure 5 applied on or impressed in the n-type epitaxial layer 4.

In a second process step, a homogeneous metal layer 8 is applied to the metal/semiconductor layer structure 5. In a third process step, a structure is etched into the metal layer 8, thereby producing a plurality of metal layer regions $8_1$ to $8_6$, the metal layer 8 patterned in this way preferably being contiguous. Metal regions $9_1$ to $9_5$ etched away by the patterning are filled with a passivation material (e.g. an insulator). An additional passivation layer 10 is applied to the resulting surfaces of the metal layer 8 and the surfaces of the passivation material regions, thereby producing a contiguous zone made of passivation material which connects a plurality of the metal layer regions $8_1$ to $8_6$ to one another.

In the first example of embodiments, the stabilization layer is essentially formed by the metal layer 6 itself, whereas in the second example of embodiment, the stabilization layer is essentially formed by the passivation layer 10.

After the application of the stabilization layer, the thickness of the n$^+$-substrate 3 may be thinned in each case in both embodiments in order to achieve a reduction of the on resistivity. Preferably, the thickness of the stabilization layers is in each case chosen such that it is one third of the thickness of the sum of the layer thicknesses of the n-type epitaxial layer 4 and of the n$^+$-type substrate 3 after thinning. A contact implantation is optionally carried out on the rear side.

After thinning by grinding, for example, a drain metallization 2 is then applied in the second embodiment.

The absolute layer thicknesses of the stabilization layer are greatly dependent on the embodiments of the respective structural parts. Typical layer thicknesses may lie in the range of 30 to 300 μm, for example, for the stabilization layers 6, 10. Preferred thickness ranges of the semiconductor layers 3, 4 corresponding thereto lie between 0 or almost 0 and 150 μm for the layers 3 and between 1 μm and 150 μm for the layers 4. However, the invention is not restricted to these thickness ranges.

After the fabrication of the structures described above, the individual DMOS elements (identified by reference symbols A and B) can be obtained by sawing along an axis 11.

The invention is not restricted to DMOS/IGBT components. The application of a stabilization layer can be applied to all semiconductor-based components appertaining to electronics.

The invention claimed is:

1. A semiconductor structure comprising:
   a semiconductor substrate;
   a semiconductor and insulator layer structure applied on the semiconductor substrate;
   a top contacting layer contacting at least one of the semiconductor and insulator layer structure and a top side of the semiconductor substrate;
   a bottom contacting layer contacting a bottom side of the semiconductor substrate; and
   a substantially contiguous stabilization layer applied on the semiconductor and insulator layer structure, wherein the thickness of the stabilization layer is about one third or more the thickness of the semiconductor substrate and is in the range of 30 μm to 300 μm, and wherein the stabilization layer is substantially metal.

2. The semiconductor structure of claim 1 wherein the semiconductor and insulator layer structure further comprises metal.

3. The semiconductor structure of claim 1 wherein the semiconductor and insulator layer structure is applied on the top side of the semiconductor substrate.

4. The semiconductor structure of claim 3 wherein the semiconductor and insulator layer is impressed in the semiconductor substrate.

5. The semiconductor structure of claim 1 wherein the semiconductor substrate is a homogeneously doped semiconductor layer.

6. The semiconductor structure of claim 1 wherein the thickness of the semiconductor substrate is substantially equal to the maximum extent of a space charge zone that can be formed in the semiconductor structure.

7. The semiconductor structure of claim 1 wherein the semiconductor structure comprises a plurality of semiconductor elements formed in or on the semiconductor substrate.

8. The semiconductor structure of claim 1 wherein the stabilization layer comprises passivation material.

* * * * *